(12) United States Patent
Chung (10) Patent No.: US 6,538,914 B1
(45) Date of Patent: Mar. 25, 2003

(54) FERROELECTRIC MEMORY WITH BIT-PLATE PARALLEL ARCHITECTURE AND OPERATING METHOD THEREOF

(75) Inventor: Yeonbae Chung, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 10/114,535

(22) Filed: Apr. 1, 2002

(51) Int. Cl.[7] ................................................ G11C 11/22
(52) U.S. Cl. ........................ 365/145; 365/63; 365/149
(58) Field of Search ................................. 365/145, 149, 365/190, 51, 63

(56) References Cited

U.S. PATENT DOCUMENTS

| | | |
|---|---|---|
| 5,671,174 A * | 9/1997 | Koike et al. ................. 365/145 |
| 5,991,188 A | 11/1999 | Chung et al. |
| 6,055,200 A | 4/2000 | Choi et al. |
| 6,088,257 A | 7/2000 | Jeon et al. |
| 6,097,624 A | 8/2000 | Chung et al. |
| 6,201,731 B1 * | 3/2001 | Kamp et al. ........... 365/185.02 |

* cited by examiner

Primary Examiner—Vu A Le
(74) Attorney, Agent, or Firm—Hogan & Hartson L.L.P.

(57) ABSTRACT

A method of generating an information signal in a 1T/1C, ferroelectric memory cell where the bit line and plate line are arranged parallel to one another is described. The method includes precharging the bit line to a voltage $V_{DD}$ while the plate line is set to ground when a word line is selected. A semiconductor memory device is also described that has an array of 1T/1C memory cells arranged in a bit-plate parallel architecture, where a plurality of adjacent memory cells that share a common plate line are read or written to simultaneously.

11 Claims, 7 Drawing Sheets

(PRIOR ART)

FERROELECTRIC MEMORY WITH BIT-PLATE PARALLEL ARCHITECTURE AND OPERATING METHOD THEREOF

BACKGROUND OF THE INVENTION

1. Field of the Invention

The invention in general relates to ferroelectric memory, and more particularly to memory architecture that enables a ferroelectric memory cell with one transistor and one capacitor ("1T/1C") in which the bit lines and plate lines are parallel. The invention also relates to an operating method for a ferroelectric memory device that reduces bit line noise caused by voltage pulses across a plate line.

2. Description of the Related Art

As the capacity and packing densities of semiconductor memory devices increase, capacitors take up larger portions of total area required for the memory cells of these devices. In order to shrink the size of memory cell capacitors and improve the overall packing density of memory cell devices, manufacturers have preferred a one-transistor one-capacitor (1T/1C) circuit with high density, but which must be continuously refreshed. These are referred to generally as dynamic random access memory (DRAM) devices. These circuits require refresh mechanisms to frequently restore the charged stored in each memory cell. Hence, these circuits are volatile in that memory loss will occur when power is removed such that refresh circuitry cannot operate. Static random access memory (SRAM) typically involves increasing complexity of the memory cell so that refresh mechanisms are not required. SRAM often has much faster access times than DRAM, but continues to suffer data loss when power is removed. SRAM circuits require more devices in each memory cell, and so are more expensive to produce.

Non-volatile memory is available in several forms. Conventional electrically programmable read only memory (EPROM), erasable electrically programmable read only memory (EEPROM) and flash EPROM devices store charge in the form of trapped charges in the memory cell's dielectric. The trapped charges are stable over a longer period of time, and so do not require dynamic refresh. However, the length of time that the stored charge is stable is limited. Moreover, conventional non-volatile memory tends to be slower to write, and requires significant power to write. Hence, conventional nonvolatile memory devices are not suitable replacements for volatile memory devices, and they tend to be used for a limited number of purposes.

Ferroelectric materials have been used as storage cell dielectrics to provide non-volatile memory. Ferroelectric materials change state substantially permanently in response to an applied electric field. For example, the ferroelectric material lead zirconate titanate (PZT), having a dielectric constant of 1000 and higher, permits a charge to be stored substantially permanently. Moreover, ferroelectric random access memory (FRAM) operates at power levels similar to conventional DRAM, and exhibits write speeds that are much faster than conventional non-volatile devices. Consequently, memory storage cells using ferroelectric capacitors can be fabricated into semiconductor memory devices with a simplified architecture and high packing density as compared to conventional non-volatile memory devices.

Ferroelectric storage capacitors do not store data in the form of charge, but instead store data by controlling the location of atoms within the crystal structure of the ferroelectric dielectric material. Write operations are largely similar to conventional DRAM-type devices as the atomic locations are manipulated by applying an electric field across the dielectric. Read operations, however, involve applying a potential across the dielectric and detecting the subsequent charge flow that results from the relocation of atoms within the crystal structure. When the applied field matches the stored state, little charge flows as little atomic relocation occurs. When the applied field is opposite that of the stored state, a significant charge flow occurs as the dielectric is essentially rewritten to the new state. Because these read operations are destructive, the state of the dielectric must be restored after a read operation.

The first designs with ferroelectric capacitors utilized memory cells containing two transistors and two ferroelectric capacitors, ("2T/2C"). Ferroelectric 2T/2C memory devices are described in the 1996 Ramtron International Corporation FRAM.RTM. Memory Products databook. 2T/2C memory cells are also described in U.S. Pat. No. 4,873,664 entitled "Self Restoring Ferroelectric Memory."

More recently, ferroelectric memory cells have been fabricated that use a single transistor and single capacitor ("1T/1C"). These ferroelectric 1T/1C memory cells include a plate line and bit line that are oriented perpendicular to each other. These devices drive a heavy capacitive load of the cell plate line, resulting in lots of circuit overhead for plate line control.

U.S. Pat. No. 5,400,275 shows an alternative architecture for a 1T/1C memory cell where the bit lines and plate lines are parallel to each other, while the word lines are orthogonal to both. But, this architecture is not suitable for low voltage operation because it cannot apply a sufficient voltage to the ferroelectric capacitor during detecting and storing the polarization on the memory cell.

The conventional read operation has the bit line precharged to V=0 while a voltage is applied to the plate line. If the initial polarization state of the ferroelectric capacitor is negative (i.e., it is storing a "1"), the read operation switches the direction of the capacitor's polarization, and a relatively large signal develops on the bit line. In contrast, if the capacitor originally has positive polarization (i.e., storing a "0"), then the read operation does not change the capacitor's polarization, and a relatively small signal develops on the bit line. The read signal developed on the bit line is normally received by a sense amplifier which compares the signal to a reference voltage ($V_{ref}$) to determine whether the capacitor stored a "0" ($V_{ref} > V_{signal}$) or a "1" ($V_{ref} < V_{signal}$).

When the bit lines and plate line are formed parallel to each other, a coupling capacitance develops between the lines. As the potential on the plate line changes during a read/write operation, the potential also changes on the bit lines due to the coupling capacitance. This potential drift on the bit lines can result in erroneous readings for the data stored by ferroelectric memory cells.

It is important that the bit line potential is affected only by the charge flow in the ferroelectric dielectric. However, when the bit lines and plate lines run in parallel, significant charge can be coupled from the plate line applied voltage to the bit lines, thereby making an accurate read operation more difficult.

Figure 1:
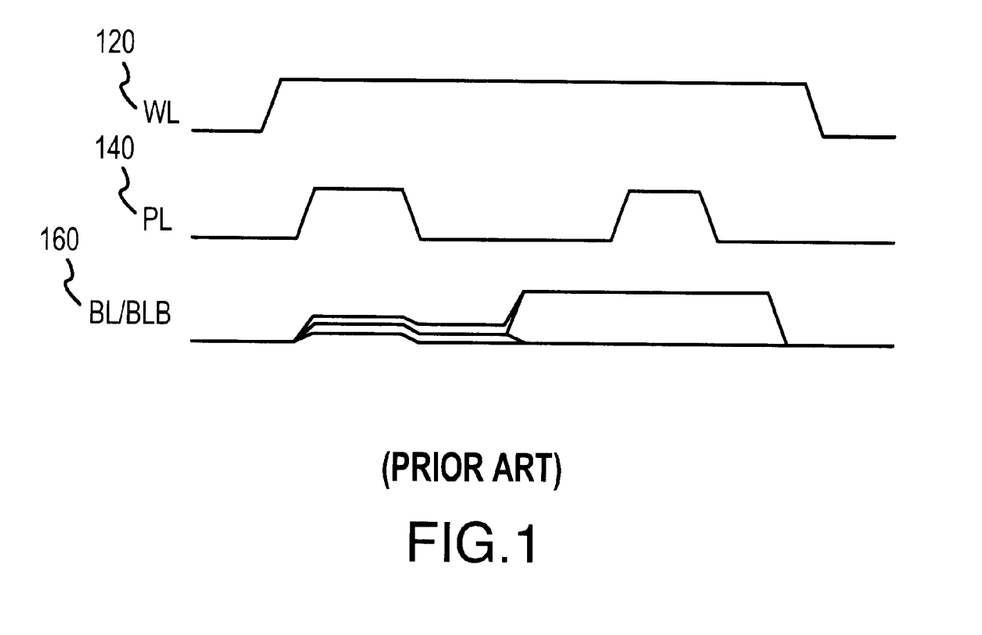
FIG. 1 is a timing diagram for a conventional ground precharged bit line read/write operation.

FIG. 1 shows how conventional read/write operations, where the plate line 140 is charged from V=0 to V=$V_{DD}$ while the word line 120 is selected, causing the bit line 160 voltage to drift away from expected values for binary "0" and "1" signals developing on the bit line 160, and bit lines of neighboring memory cells. The drift narrows the range of voltages $V_{signal}$ can have before erroneously crossing the $V_{ref}$ threshold. The reduced margin of error for $V_{signal}$ causes more false readings of the information in the memory cell being read, as well as neighboring memory cells.

The drift caused by precharging the plate line to $V_{DD}$ hinders the ability to simultaneously read or write to adjacent memory cells that share a common plate line. Thus, current semiconductor memory devices with 1T/1C, bit-plate parallel memory arrays do not simultaneously read from or write to adjacent memory cells that share a common plate line. These semiconductor memory devices read and write to a single memory cell at a time.

What is desired, therefore, is a 1T/1C, bit-plate parallel, ferroelectric memory architecture that provides high margin for read operations and is relatively immune from voltage drift in the read signal that develops on the bit line.

BRIEF SUMMARY OF THE INVENTION

The present invention includes a method for generating an information signal and semiconductor memory device that has a 1T/1C, bit-plate parallel memory cell architecture without read errors caused by precharging a plate line shared by a plurality of memory cells to $V_{DD}$. The present invention also includes a 1T/1C, bit-plate parallel, semiconductor memory device, and method, for simultaneously reading or writing to a plurality of memory cells. The invention also preferably includes simultaneously reading or writing to a plurality of memory cells that are adjacent to one another, and that share a common plate line.

The method of the present invention for generating an information signal from a 1T/1C, bit-plate parallel, ferroelectric memory cell comprises the steps of precharging the bit line to a voltage level $V_{DD}$; maintaining the plate line voltage at ground level; selecting a word line; and generating the information signal on the bit line, wherein a voltage of the information signal depends on a polarization of the ferroelectric capacitor of the memory cell.

The present invention also includes a semiconductor memory device comprising a ferroelectric memory array comprising a plurality of ferroelectric memory cells, wherein each of the memory cells has one transistor, connected to a word line, and one ferroelectric capacitor, connected to a bit line and a plate line; a row decoder connected to the word line; at least one column signal line connected to each of the memory cells; and a column signal decoder connected to said at least one column signal line, wherein said at least one column signal line simultaneously addresses at least eight of the memory cells; and wherein the bit line and plate line are parallel.

The foregoing and other objects, features and advantages of the invention will become more readily apparent from the following detailed description of the invention, which proceeds with reference to the accompanying drawings.

DETAILED DESCRIPTION OF THE INVENTION

In general, the present invention is directed to a ferroelectric memory architecture and method for accessing a ferroelectric memory cell that offers improved space utilization on an integrated circuit. The invention is implemented in a folded bit line 1T/1C ferroelectric memory array in which each memory cell comprises a pair of storage bits, one of which is accessed at any given access cycle. Using this architecture, a plate line that is shared by many storage cells can be implemented. Because this configuration doesn't need the plate control circuitry, it can greatly increase the memory cell efficiency. Another feature of the invention is that rather than precharging a shared plate line prior to reading memory cell contents, the bitline is precharged which controls the effect of capacitive charge coupling exhibited in prior architectures. In turn, memory cells that share the plate line can be read simultaneously. In this manner, a single column of memory cells can be selected to access a plurality of memory cells in contrast with prior designs that required multiple columns to be selected. More space efficiency results in part because fewer control signal lines need to be routed in the design to select an entire column.

Figure 2:
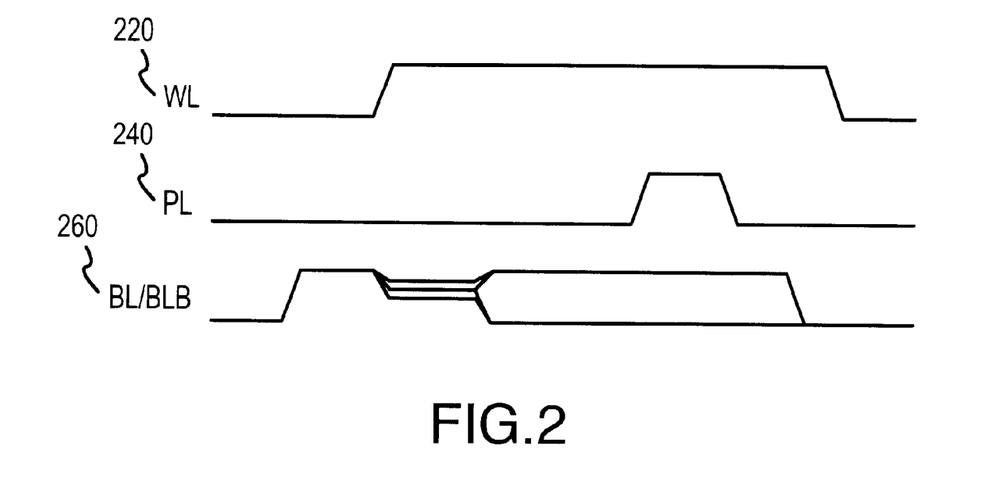
FIG. 2 is a timing diagram.showing a $V_{DD}$ precharged bit line according to the present invention.

FIG. 2 illustrates a timing diagram, to be contrasted with the diagram illustrated in FIG. 1, that shows the relative voltages on the word line 220, plate line 240 and bit lines 260 according to an embodiment of the present invention. At the start of the read cycle, the plate line 240 and bit line 260 are coupled to ground. Voltage on the bit lines 260 is increase from 0V to $V_{DD}$ to precharge the bit lines 260, while the word lines 220 and plate lines 240 are at 0V. Because the plate line 240 remains coupled to ground, any charge coupled from the bit lines 260 to the plate line 240 is removed, and does not cause the relative voltages to change. Then, after the bit lines 260 reach $V_{DD}$, they are decoupled from the precharge voltage source and the word line 220 is selected by increasing the word line 220 voltage from 0V to $V_{PP}$ while the plate line 240 remains grounded at 0V. When the word line 220 is selected, the bit line 260 potential is applied across the selected ferroelectric capacitors to cause charge relocation in the capacitor.

After the word line 220 is selected the voltage on the precharged bit lines 260 drop by an amount that depends on the polarization of the charge stored in the ferroelectric capacitor. A sense amplifier compares the voltage drop on the bit lines 260 to a reference voltage, $V_{ref}$, which is generated on a complementary bit line, to determine whether the ferroelectric capacitor was polarized to store a "0" or "1". The sense amplifier then drives the voltage on the bit lines 260 either high (preferably $V_{BL/BLB}=V_{DD}$) or low (preferably $V_{BL/BLB}=0V$) depending on the polarization of the capacitor.

As the sense amplifier compares the voltage drop on the bit lines 260 and drives them high or low, the voltage on the plate line 240 stays constant, preferably at $V_{PL}=0V$ and the plate line 240 remains coupled to ground to prevent voltage drift. Maintaining the plate line 240 at a constant voltage reduces the voltage drift on adjacent bit lines that share the plate line 240 caused by rapid changes in the plate line 240 voltage. Because the plate line 240 is not floating, stray charge coupled to the plate line 240 does not affect other voltages in the system. Consequently, the bit line 260 voltages do not drift towards the reference voltage level, and away from the preset "0" and "1" voltage levels, increasing the chances for an erroneous read/write operation.

Figure 3:
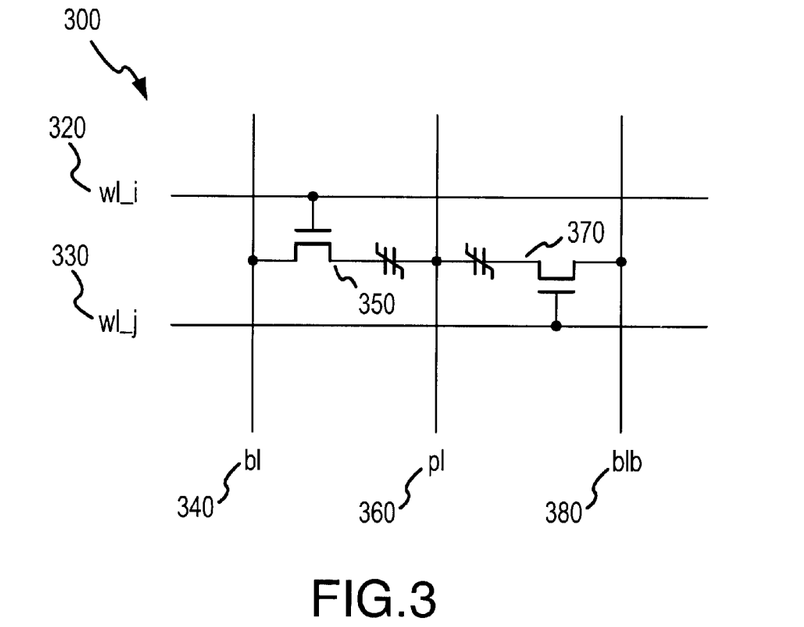
FIG. 3 is a circuit diagram.showing an arrangement of a memory cell of a memory device with bit-plate parallel architecture.
Figure 4:
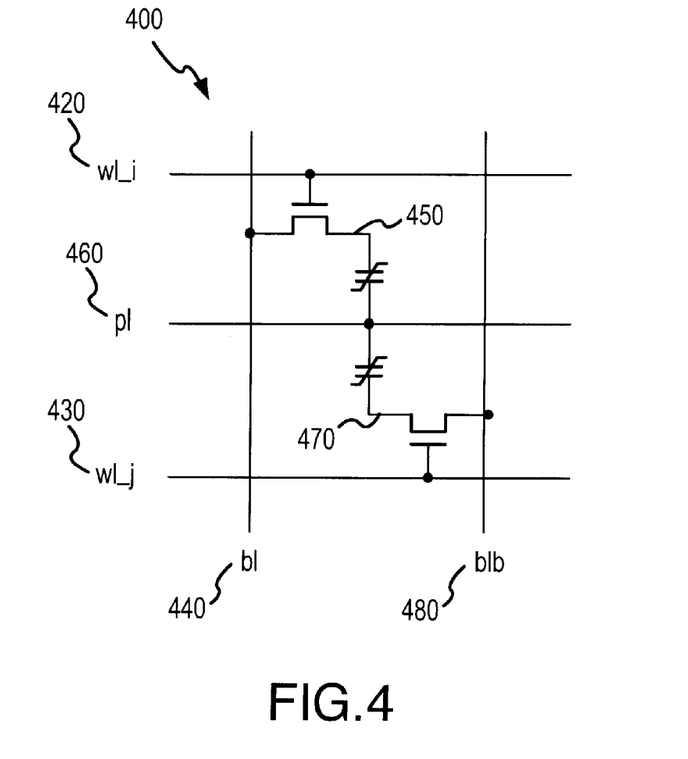
FIG. 4 is a circuit diagram showing an arrangement of a memory cell of a conventional memory device were bit lines and plate line are perpendicular.

The semiconductor memory devices of the present invention comprise 1T/1C memory cells 300 with bit-plate parallel architecture like that illustrated in FIG. 3. The 1T/1C memory cells 300 used in the present invention differ from conventional 1T/1C memory cells 400 where the bit lines 440, 480 and plate line 460 are perpendicular, as illustrated in FIG. 4.

The architecture of the exemplary embodiments can be understood as a collection of a few basic functional units that are generally oriented in a columnar fashion and repeated across any number of columns to provided a desired quantity of storage on a single integrated circuit or system. The basic storage unit is a storage cell comprising a pair of storage locations 350, 370, one accessible by an even word line 320 and the other being accessible by activating an odd word line 330. In the particular example, each column is eight cells (i.e., sixteen bit lines) wide. An even word line 320 couples to one storage location 350 in each cell and an odd word line 330 couples to the other storage location 370 such that the eight even or the eight odd memory locations can be accessed during any given cycle.

Each column comprises 256 rows of storage cells, or 512 total word lines, so that each column implements 256×16 or 4 Kbits of storage. A pair of bit lines extends through the column for each storage cell to shared sense amplifiers, and reference circuitry used to provide the reference voltage into complementary bit lines during read operations. A column signal generator selectively activates a particular column in response to applied addresses, and a row decoder selectively activates a single word line during an access cycle such that eight bits in a given column can be accessed simultaneously.

Figure 5:
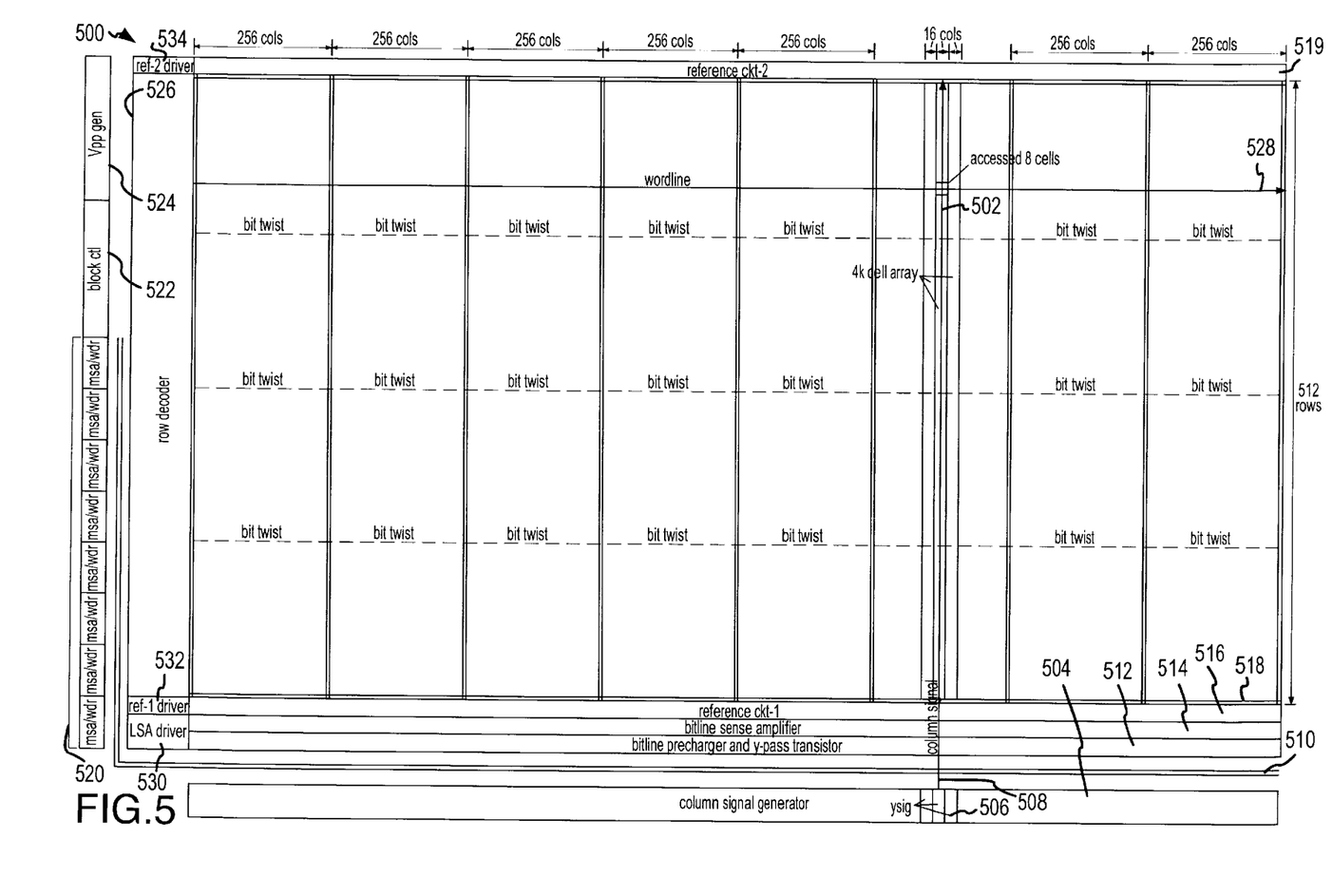
FIG. 5 is a diagram showing a memory cell array of the present invention.

Referring now to FIG. 5, a memory array 500 of the present invention is shown that comprises a plurality of columnar arrays 502 of memory cells of the present invention. In the preferred memory array shown, there are 128 columnar arrays of memory locations where each of the columnar arrays 502 of memory cells is preferably 16 individual, 1T/1C memory locations across and preferably 256 individual memory cells deep, so that each columnar array 502 preferably comprises 4096 individual memory cells. In FIG. 5, the reference circuitry is composed of two embodiments. One embodiment utilizes the ferroelectric capacitors of the same size and layout as the memory cell (illustrated as Ref-1). The second embodiment is charge-sharing reference circuitry (illustrated as Ref-2). In this invention, either of two reference methods can be used.

The memory array 500 also preferably includes additional shared circuitry that is located on the top, bottom and sides of the plurality of columnar arrays 502 of memory cells. In FIG. 5, the additional circuitry at the bottom of the memory array preferably includes, starting from the bottom up, a column signal generator 504 that comprises a series of consecutive y-sig circuits 506. The column signal generator is in electronic communication, via the y-sig circuits 506, with column signal lines 508 that reach the 256 rows of memory cells in each columnar array of memory cells 502.

Above the column signal generator is preferably a 16-bit dataline 510, then preferably bitline precharge component and y-pass transistor circuitry 512, followed by bit sense amplifier circuitry 514 and then Ref-1 circuitry 516. Above the Ref-1 circuitry is preferably a dummy word line 518 and then the columnar arrays of memory cells 502. Above the columnar array of memory cells, at the top of the memory array, is preferably located the Ref-2 circuitry 519.

Additional circuitry is also preferably located on the side of the memory array shown in FIG. 5. This additional circuitry preferably includes main sense amplifier and write driver 520, block control circuitry 522, and $V_{pp}$ generator 524. Also preferably present is row decoder circuitry 526. Word lines 528 that traverse the plurality of columnar arrays of memory cells are in electronic communication with the row decoder circuitry 526. LSA driver circuitry 530 and Ref-1 driver 532 circuitry are also present as is the Ref-2 driver circuitry 534.

Figure 6:
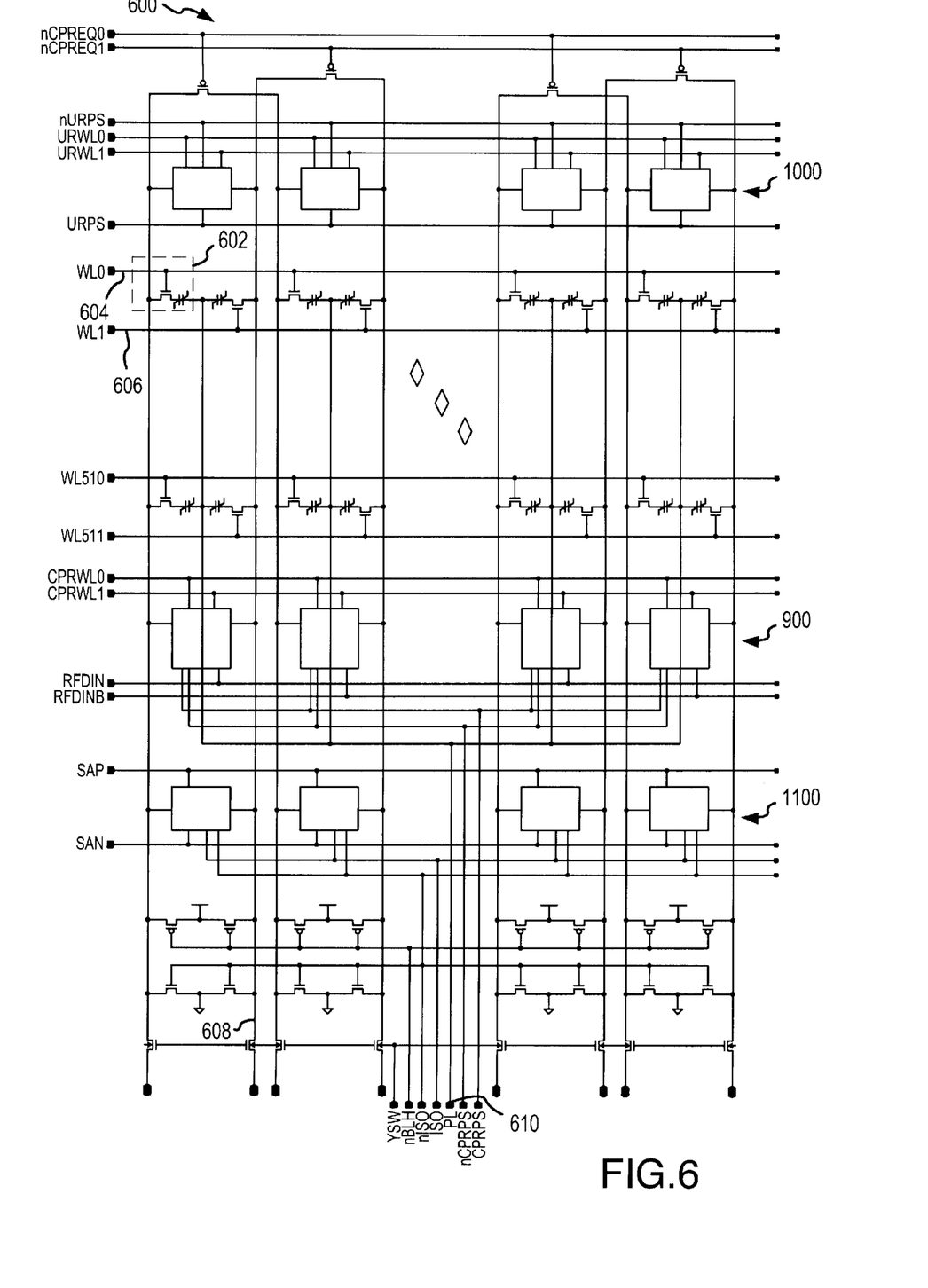
FIG. 6 is a diagram showing a memory cell array of the present invention.

Referring now to FIG. 6, one of the plurality of columnar arrays of memory cells 600 according to FIG. 5 is shown. The array is made up of rows of ferroelectric memory cells 602, where each row spans 16 individual 1T/1C memory cells 602 across. A pair of word lines 604, 606 preferably address the 16 individual memory cells 602; each word line 604, 606 preferably addressing every other individual memory cell 602 along the row. The rows form a column from the 256 individual rows.

Bit lines 608 and plate lines 610 run parallel to the long axis (the y-axis) of the column while the word line pairs 604, 606 cut perpendicular to the long axis. Plate lines 610 are preferably shared between adjacent pairs of individual memory cells 602.

Figure 7:
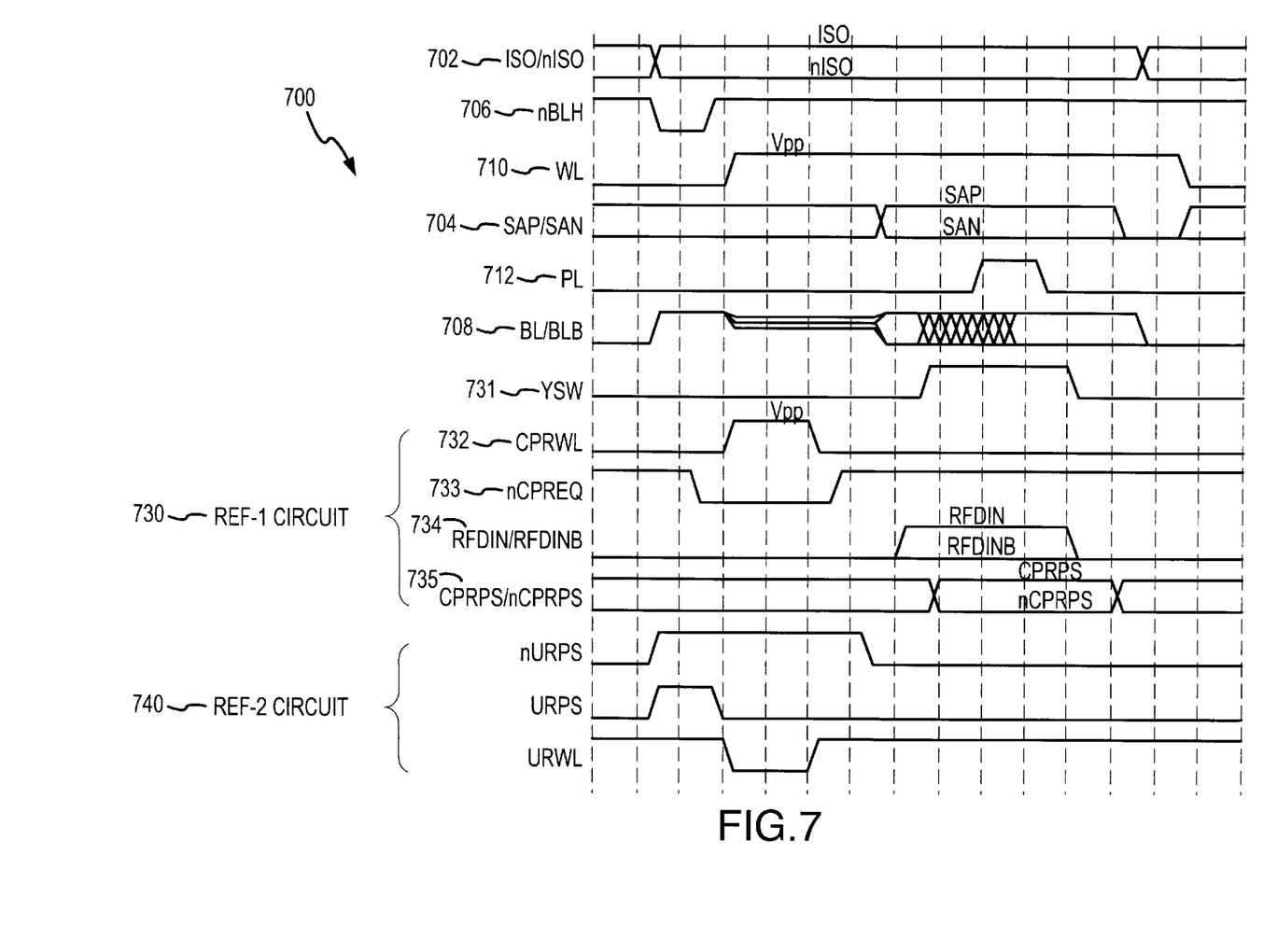
FIG. 7 is a full read/write timing diagram according to the method of the present invention.

Referring now to FIG. 7, an example of a read/write timing diagram 700 according to the present invention is shown. Either of two reference circuits can be used in the present invention. The read/write cycle starts with ISO and nISO 702. ISO and nISO 702 couple the sense amps of a particular column to the bit lines, hence selecting the column for operation. SAP and SAN signals 704 are set such that the sense amps are not powered, but they are selected and ready to fire as soon as SAP and SAN switch states to apply power to the sense amps. Switching voltage levels, nBLH 706 (the control signal that causes the bit lines BL to be driven high and therefore precharged ) goes low and high. The bit line pairs 708 are precharged to $V_{DD}$ and the floated.

To read out a stored value in a cell, the wordline 710 is switched from 0 to $V_{PP}$. Charges transfer from bitlines to ferroelectric capacitors, producing a data voltage on bitlines 708. At the same time, a reference voltage needed for sensing the bitline voltages is generated in the currently non-selected bitlines by either of Ref-1 730 or Ref-2 740 circuits. It is a mid-level voltage between data "1" and data "0". Then, a sense amplifier (SAP and SAN), connected to the bitline pair, amplifies the differential voltage between bitlines. The bitlines corresponding to cells with data 1 are driven to the full $V_{DD}$ level and the bitlines corresponding to the cells with data 0 are driven to ground. After sensing the data, the plate line 712 (PL) is brought to $V_{DD}$ and then to the ground level for the restore operation. At the end of the read cycle the bit lines 708 return to ground, preferably 0V, ISO and nISO 702 switch voltages back to their voltages at the start of the cycle, power is removed from the sense amplifiers by toggling the SAN and SAP 704 signals, and the word line 710 is deselected by returning to ground, preferably 0V. The circuits are now ready to repeat the cycle with all the circuit elements back to their states at the start of the cycle.

To write a value into the cell, the timing is similar to that of the read operation. After the sense amplifiers have determined the initial state of the accessed memory cells, a write request allows changing data state on the selected bitlines 708 when the column gate 731 (YSW) is enabled. It is done by a write driver during cross hatched time duration in FIG. 7. With the bitlines held in their new state, PL is brought to $V_{DD}$ and to the ground level. Then, the new data state is stored into the ferroelectric capacitors.

Figure 8:
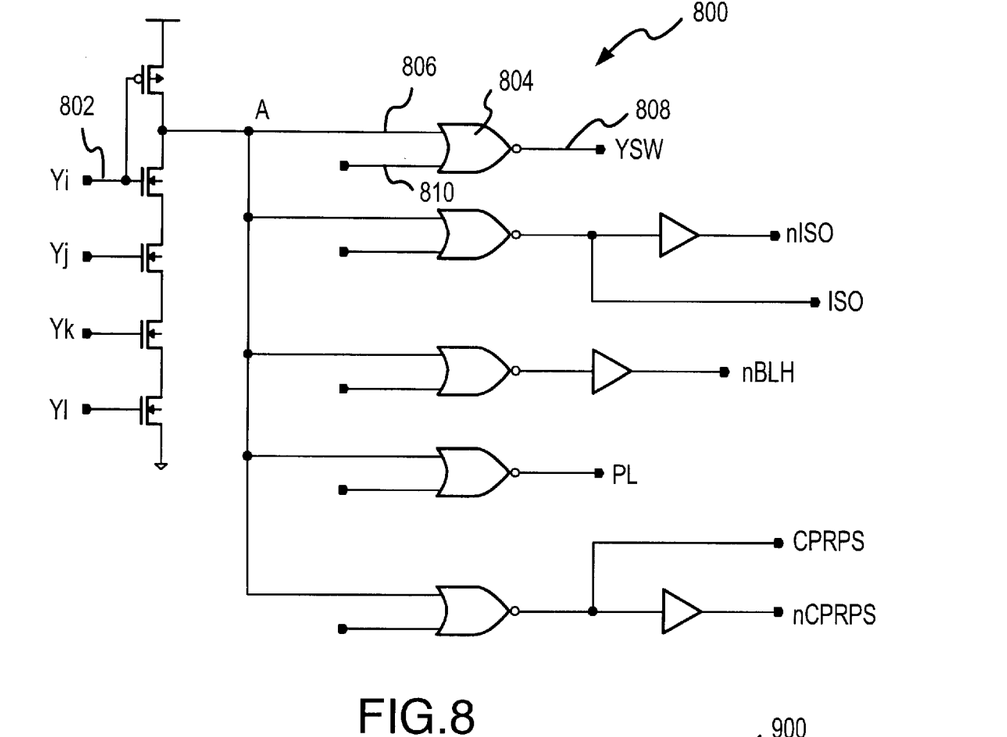
FIG. 8 is a circuit diagram showing a Y-signal component of the present invention.

Referring now to FIG. 8, a Y-signal circuit 800 schematic of the present invention is shown. The Y-signal circuit 800 preferably implements the various column control signals needed for read/write operations in response to the control signals received by the array. The circuit preferably receives 4 bits of column select signal 802 (Yi, Yj, Yk, and Yl). These bits are derived from the least signficiant bits of the address, and will all be a logic high when this column 802 is selected.

In a preferred aspect, when the 4 bits of column select signal 802 are all high, they pull the A lines 806 of the NOR gates 804 low. If any one of the Yi–Yl signals 802 is low, the A inputs 806 to the NOR gates 804 are preferably high, and the various enable signals will not pass to the outputs 808. With the A inputs 806 low, the NOR gates 804 preferably pass the signals on their B lines 810 to their outputs 808 (inverted) and the other circuits preferably create complements.

Figure 9:
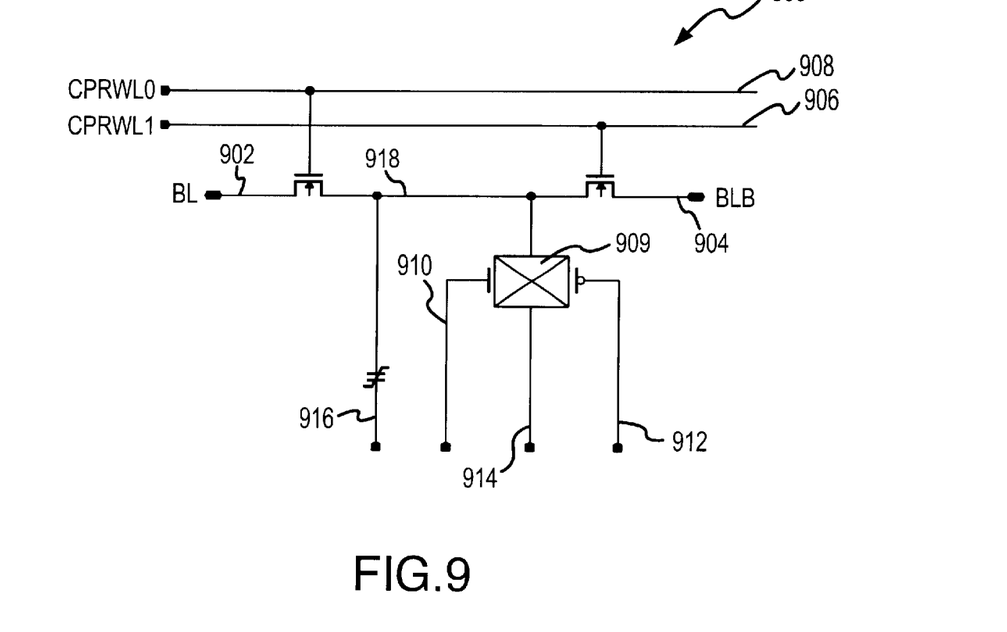
FIG. 9 is a circuit diagram showing complementary data preset reference citcuitry.

Referring now to FIG. 9, a complementary data preset reference circuit 900 schematic of the present invention is shown. The circuit 900 represents one example of the Ref-1 circuitry of the present invention. For example, in FIG. 6 pairs of adjacent Ref-1 cells 900 are prepolarized to the 1 state in one cell and the 0 state in the other. Referring to the Ref-1 cell 900 timing of FIG. 7, the reference voltage is produced by making nCPREQ 733 low to provide the average voltage of data 0 and data 1 signal on the complementary bit lines. When the complementary bit line 904 is selected by CPRWL1 line 906 at substantially the same time the real bit line is selected by one of the wordlines (WL0, WL2, . . . WL510 in FIG. 6), the sense amplifier can make a comparison between the real data and the reference voltage on the dummy bit line.

After the CPRWL1 line 906 goes low and the normal read is finished, preset portion of the cycle is entered by CPRPS 910 and nCPRPS 912, in electronic communication with the transmission gate 909, becomes active. The transistors gated by CPRPS 910 and nCPRPS 912 link the reference cell to the RFDIN or RFDINB 914 signals to provide the bias to the internal capacitor node to accomplish polarization. The bottom plate of capacitor is connected to plate line 916 (PL). With the top plate 918 biased to either $V_{DD}$ or 0 V, the bottom plate (PL) is pulsed to $V_{DD}$ and back to 0 V. RFDIN and RFDTNB 734 are held to be the opposite data state during the PL pulse. This will polarize the adjacent reference cells to the opposite states. Before CPRPS 910 and nCPRPS 912 switched off, the voltage is removed from the capacitor top plate 918 so that the polarization charges are transferred and sensed in the next cycle.

Figure 10:
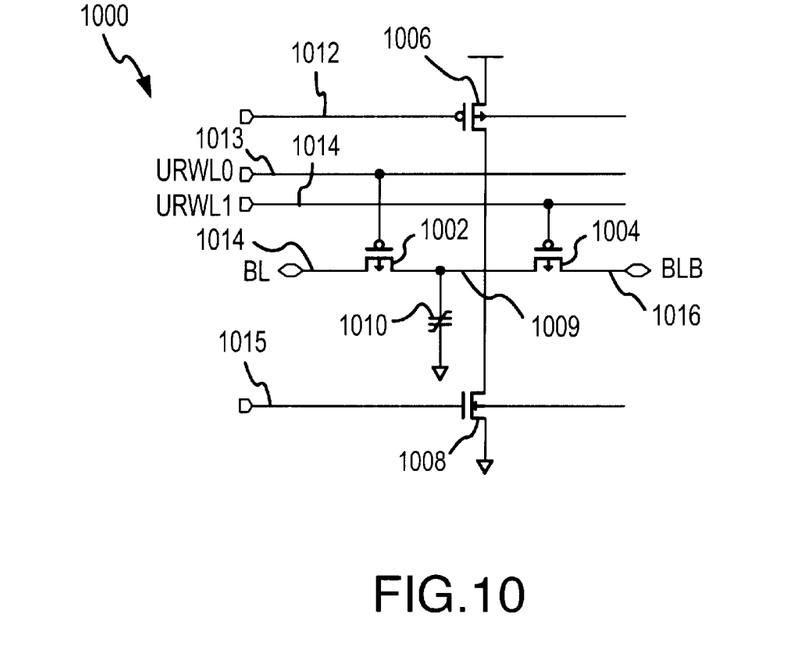
FIG. 10 is a circuit diagram showing charge-sharing reference circuitry.

Referring now to FIG. 10, a charge-sharing reference circuit 1000 schematic of the present invention is shown. The circuit 1000 represents one example of the Ref-2 circuitry of the present invention. It is constructed with dual PMOS gates 1002, 1004, a set of pre-biasing PMOS 1006 and NMOS 1008 transistor and one ferroelectric capacitor 1010. The nURPS line 1012 initially biases the top plate of reference capacitor 1009 to $V_{DD}$ level. It eliminates the relaxation component, which may result from a ferroelectric capacitor according to time without bias. When accessed, nURPS 1012 goes high and the signal URPS 1015 makes the top plate of reference capacitor 1009 to the ground level. When the reference wordline URWL is pulled down to low, the charges in bitline initially precharged to $V_{DD}$ are shared with the reference capacitor 1010 to provide the reference voltage in the complementary bit lines.

Figure 11:
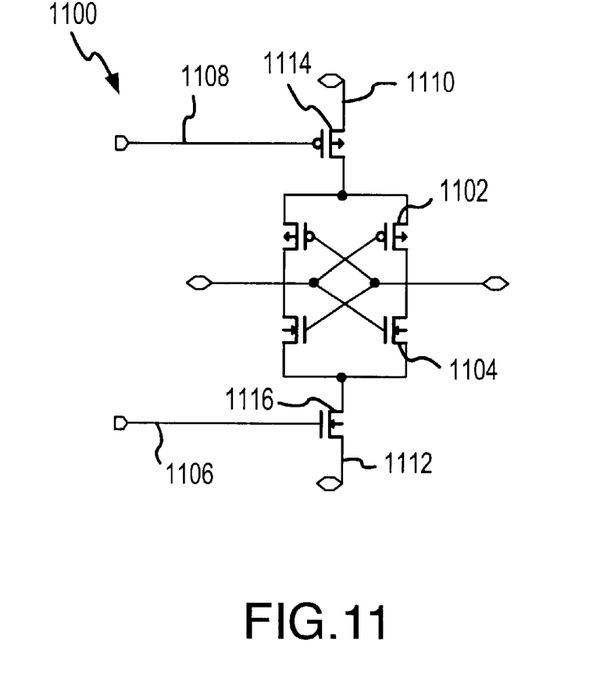
FIG. 11 is a circuit diagram showing bitline sense amplifier.

FIG. 11 shows a detailed circuit configuration of bitline sense amplifier 1100. In the present invention, a column selected sense amplifier is employed. The sense amplifier is selected by PMOS 1114 and NMOS 1116 access gates. For each access, the column signals (ISO and nISO) 1106,1108 enable and disable the bitline sense amplifiers only in selected columns. The remaining un-accessed columns are undisturbed because the bit lines are clamped to ground, the sense amplifiers are isolated from SAP 1110 and SAN 1112 signals, and column-path gates 1114, 1116 stay turned off.

Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention, as hereinafter claimed.

What is claimed is:

1. A method of generating an information signal from a first ferroelectric memory cell, wherein the first memory cell has one transistor and one ferroelectric capacitor, and wherein a word line is in electronic communication with the transistor, a first bit line in electronic communication with a first electrode of the ferroelectric capacitor and the transistor, and a plate line is in electronic communication with a second electrode of the ferroelectric capacitor, said method comprising the steps of:

precharging the first bit line to a voltage level $V_{DD}$;
   maintaining the plate line voltage at ground level;
   selecting the word line; and
   generating the first information signal on the first bit line, wherein a voltage of the information signal depends on a polarization of the ferroelectric capacitor, and wherein the first bit line and the plate line are parallel.

2. The method of claim 1, comprising the step of:
   activating a row address line and a column address line in order to select the word line, wherein the row address line and the column address line are activated by a row and column address.

3. The method of claim 1, comprising the step of:
   activating a row address line and a column address line in order to select the plate line, wherein the row address line and the column address line are activated by a row and column address.

4. The method of claim 1, comprising the steps of:
   activating a sense amplifier with a row and column address;
   comparing the first information signal with a reference voltage signal in the sense amplifier in order to determine an information state of the first memory cell; and
   generating an amplified information signal on the first bit line that reflects the information state of the memory cell.

5. The method of claim 1, comprising the steps of:

providing a second bit line in electronic communication a second ferroelectric memory cell;

providing a sense amplifier in electronic communication with the first bit line and the second bit line;

comparing the first information signal on the first bit line with a second information signal on the second bit line in order to determine an information state of the first memory cell; and generating an amplified information signal on the first bit line that reflects the information state of the memory cell.

6. A method of generating an information signal from a semiconductor memory device that includes a plurality of ferroelectric memory cells, wherein each of said memory cells has one transistor and one ferroelectric capacitor, and wherein a word line is in electronic communication with the transistor, a bit line is in electronic communication with a first electrode of the ferroelectric capacitor and the transistor, and a plate line is in electronic communication with a second electrode of the ferroelectric capacitor, the method comprising the steps of:

precharging the bit line to a voltage level $V_{DD}$;

maintaining the plate line voltage at ground level; selecting the word line; and generating the information signal on the bit line, wherein a voltage of the information signal depends on a polarization of the ferroelectric capacitor; and wherein the bit line and plate line are parallel.

7. The method of claim 6, wherein said plurality of memory cells comprise two or more adjacent memory cells, and wherein the plate line is connected to the ferroelectric capacitor in each of the adjacent memory cells.

8. The method of claim 6, wherein said bit lines connected to the ferroelectric capacitors of the plurality of memory cells are simultaneously precharged.

9. A semiconductor memory device having a ferroelectric memory array comprising a plurality of ferroelectric memory cells, wherein each of said memory cells has one transistor and one ferroelectric capacitor, and wherein a word line is in electronic communication with the transistor, a bit line is in electronic communication with a first electrode of the ferroelectric capacitor and the transistor, and a plate line is in electronic communication with a second electrode of the ferroelectric capacitor, said memory device comprising:

a row decoder connected to said word line;

at least one column signal line connected to each of said memory cells;

a column signal decoder connected to said at least one column signal line, wherein said at least one column signal line simultaneously addresses at least eight of the memory cells, and wherein the bit line and plate line are parallel.

10. The semiconductor memory device of claim 9, comprising:

a sense amplifier connected to the bit line.

11. The semiconductor memory device of claim 9, wherein said transistor is a MOS transistor that has a gate, a source, and a drain;

wherein said word line is connected to the gate, said bit line is connected to the source, and said first electrode of the ferroelectric capacitor is connected to the drain.

* * * * *